US006736521B1

(12) United States Patent
Turner (10) Patent No.: US 6,736,521 B1
(45) Date of Patent: May 18, 2004

(54) ON AXIS TRANSLATIONAL MOTION STOPS FOR MOVABLE STRUCTURE HAVING TORSIONAL HINGE

(75) Inventor: Arthur Monroe Turner, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/335,750

(22) Filed: Jan. 2, 2003

(51) Int. Cl.$^7$ ................................................ G02B 7/182
(52) U.S. Cl. ...................... 359/876; 359/877; 359/878; 359/872; 359/223; 359/224
(58) Field of Search ................... 359/876, 877, 359/878, 872, 223, 224; 250/201.1, 227.24

(56) References Cited

U.S. PATENT DOCUMENTS 4,512,036 A * 4/1985 Laor .......................... 398/156
5,177,348 A * 1/1993 Laor .......................... 250/201.1
6,295,154 B1 * 9/2001 Laor et al. .................... 359/223

* cited by examiner

Primary Examiner—Mohammad Sikder
(74) Attorney, Agent, or Firm—William B. Kempler; W. James Brady, III; Frederick J. Telecky, Jr.

(57) ABSTRACT

A device 21 comprises a movable structure 44 having a first movable portion 70 hinged to frame portion 60 by a first pair of hinges 81, 82 spaced apart along a first axis 91. The first movable portion 70 has an edge 140 that is substantially perpendicular to the first axis and substantially parallel with and immediately adjacent to an edge 132 of the frame portion 60, such that a tolerance space 120 defined therebetween. At least one projection 122 extends from one or both of the edges 132 and/or 140. The projection 122 is adapted to limit translational motion of the first movable portion 70 relative to the frame portion 60 within the plane. The device 21 motion between the first movable portion 80 and a second pivot axis 112 with translational motion between the first movable portion 70 and the second movable portion 80 limited by a similar projection.

22 Claims, 5 Drawing Sheets

ON AXIS TRANSLATIONAL MOTION STOPS FOR MOVABLE STRUCTURE HAVING TORSIONAL HINGE

TECHNICAL FIELD

The present invention generally relates to devices having at least one torsional hinge, and more particularly to MEMS (micro-electro mechanical systems) optical devices with movable mirrors and motion stops for limiting undesirable translational motion of such mirrors.

BACKGROUND

In recent years optical fibers have come into wide spread use in a wide variety of applications in which optical signals are transmitted along such fibers and are switched from one optical fiber to another using an optical switch system. Optical switches generally include structure to support fiber positioning, alignment signal emitters and interconnected computer control electronics. A fiber positioning structure is provided near the end of each fiber to selectively point the end of a fiber to one fiber group toward the end of a selected fiber in another fiber group to provide switched optical transmission between the two fibers. Examples of optical switches are shown in U.S. Pat. Nos. 4,512,036 and 5,177,348.

Movable mirrors having torsional hinges may be used as the switching device in such optical switching systems to reflect, route, and/or attenuate light of the optical signals. This type of mirror may also be used for many other purposes. However, the durability and life span of current torsion-hinge movable mirror devices have suffered due to failures in the torsional hinge which allows pivoting of the devices. Such failures are at least partly because the torsional hinge mirror devices often experience translational motion in the mirror surface plane due to vibrations and/or shock during manufacturing, handling, and shipping. In other words, translational movement of the mirror element in the plane of the mirror surface may cause a hinge of the movable mirror device to experience bending and/or shear forces in directions other than the generally intended rotation (e.g., for tilting the mirror element during intended use of the device). Since unwanted or unintended forces are often the cause of failure for these devices, there is a need for reducing or eliminating such unwanted or unintended forces experienced by the hinges of a torsion-hinge movable mirror device.

Texas Instruments presently manufactures a two-axis analog mirror MEMS device fabricated out of a single piece of material (such as silicon, for example) typically having a thickness of about 100–115 microns. The layout consists of a mirror (normally about 3.8 mm×3.2 mm) supported on a gimbal frame by two silicon torsional hinges. The gimbal frame is attached to a support frame by another set of torsional hinges. A similar single axis mirror MEMS device may be manufactured by eliminating the gimbal frame, and extending the mirror torsional hinges directly to the support structure.

The problem of translational motion and forces exerted on a torsional hinge may also exit in devices other than movable mirror devices. Hence, there is generally a need for a way to reduce or eliminate unwanted or unintended translational motion and forces experienced by a torsional hinge in these devices.

SUMMARY OF THE INVENTION

The problems mentioned above are addressed by the present invention, which according to one embodiment, provides a device having a movable structure. The movable structure includes a frame portion and a movable portion, such as a mirror, which is hinged to the frame portion by a first pair of torsional hinges spaced apart along an axis, such that the movable portion can pivot about the axis relative to the frame portion. The movable portion has at least one edge that is substantially perpendicular to the axis and substantially parallel with and immediately adjacent to a corresponding edge of the frame portion. The two substantially parallel edges are spaced a small distance apart, and at least one projection extends from one or both of the edges into the spaced defined by these two substantially parallel edges. The projection is adapted to limit relative translational motion between the movable portion and the frame portion. According to another embodiment, similar spaces perpendicular to the axis are defined proximate both torsional hinges with each space having at least one projection extending into the space from one of the two parallel edges. Still another embodiment may include a pair of spaces with their corresponding projections located on each side of one or both of the torsional hinges.

In accordance with another aspect of the present invention, an optical device is provided having a structure similar to that discussed above wherein the movable portion is a mirror formed from a single piece of substantially planar material.

According to still another embodiment, the optical device may be an inner mirror portion having a reflective mirror surface formed thereon, and may further comprise another or second movable portion. The second movable portion may be hinged to the first mentioned movable portion by another set or pair of hinges spaced apart along a second axis in the plane, such that the second movable portion can pivot relative to the first mentioned movable portion about the second axis. A reflective mirror surface may be formed on the second movable portion to form an inner mirror, wherein the first movable portion is an intermediate gimbals portion. In a manner similar to that discussed above, a projection may extend from one or both of an edge of the second movable portion which is perpendicular to the second axis or a corresponding second edge of the first movable portion, which is parallel to the edge of the second movable portion. The projection again extends within a space formed between the second edge of the first movable portion and the corresponding parallel edge of the second movable portion. In the same manner as discussed above, this projection is also adapted to limit translational motion of the second movable portion relative to the first movable portion. According to one embodiment, the first axis will be substantially perpendicular to the second axis.

DESCRIPTION OF THE DRAWINGS

Other objects and advantages of the invention will become apparent upon reading the following detailed description and upon referencing the accompanying drawings, in which.

DETAILED DESCRIPTION OF ILLUSTRATIVE EMBODIMENTS

Like reference numbers in the figures are used herein to designate like elements throughout the various views of the present invention. The figures are not intended to be drawn to scale, and in some instances for illustrative purposes, the drawings may intentionally not be to scale. One of ordinary skill in the art will appreciate the many possible applications and variations of the present invention based on the following examples of possible embodiments of the present invention.

The present invention relates to a device with a movable structure, such as a mirror, that has torsional hinges. Such a device made in accordance with the present invention provides translational motion bump stops to reduce or eliminate damage to the device caused by translational motion or force on the torsional hinges.

Figure 1:
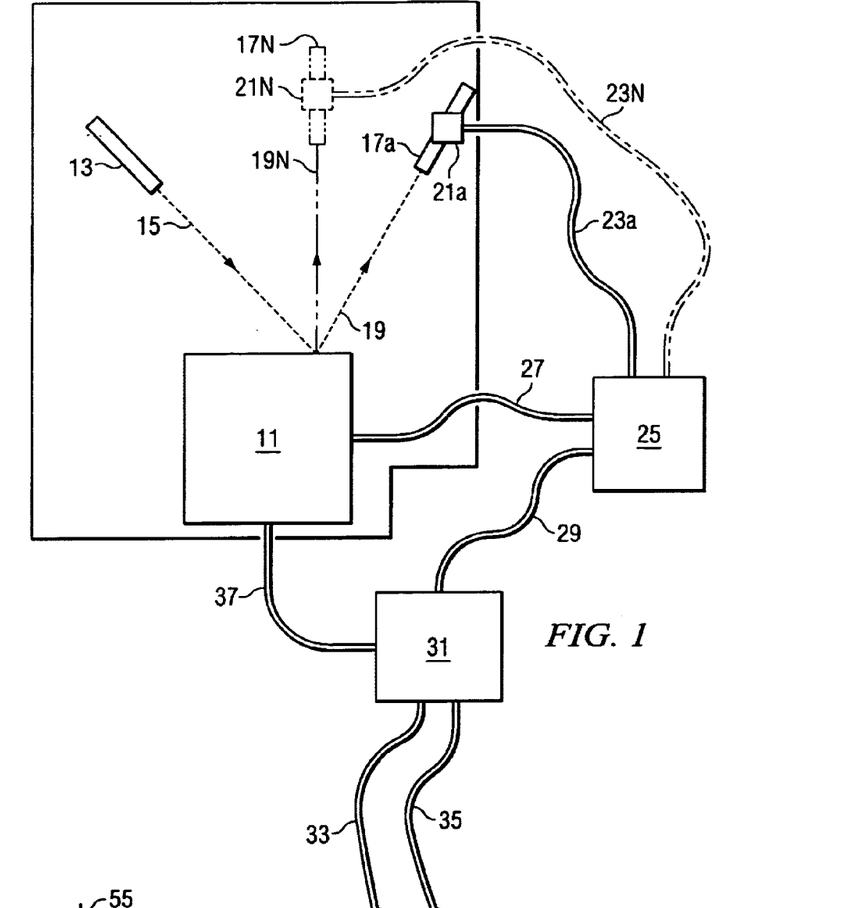
FIG. 1 is a diagrammatic representation of an optical switching system using an array of mirrors that are selectively rotatable about at least one axis.

Referring now to FIG. 1, there is shown a system level diagram for providing optical switches using an array of analog mirrors. As shown in FIG. 1, there is included optical switching apparatus 11 comprising an array of optical mirrors, the associated drivers and the position monitoring electronics. In the illustrated embodiment, there is a source fiber optic 13 which is providing an optical signal carrying data such as a laser beam 15. Also as shown, there is a second optical fiber 17A which is indicated as receiving an optical signal 19 from a mirror on the array of mirrors (not shown) in apparatus 11. There is also another receiving fiber 17N indicated by dotted lines. It will be appreciated by those skilled in the art, that although there is only one source fiber optic 13 and only two receiving fiber optics 17A and 17N illustrated in the diagram, there may be tens, hundreds or even thousands of both the source fibers and the receiving fibers as indicated by the letter "N" for the receiving fiber optic 17N. Although there may be a huge multiplicity of such optical fibers, it is only necessary to illustrate one emitting fiber (13) and one receiving fiber (17A) to describe the features of the present invention. However, the reader should understand that everything discussed with respect to source fiber 13 and receiving fiber optic 17A is true for the other multiplicity of fiber optics that may be included. Also as shown, fiber optic 17A includes a beam monitor device 21A for sensing the optical signal strength. The beam monitoring device 21A converts the optical signal to an electrical signal representative of the strength of the beam and provides an electrical signal representation to electrical or feedback cables 23A. Feedback cable 23A goes to a system control box 25, and as will become clear, system control box 25 also receives signals on cable 27 indicative of the position of each of the mirrors of the array of mirrors in the apparatus 11. For a two-axis analog mirror in the array, there may typically be feedback signals provided from four different sensors in apparatus 11 for each of the mirrors of the array. System control box 25 provides the necessary control information signals on cable 29 to the drive electronics 31. Also as shown, drive electronics 31 receives a ground and power line 33 and 35 as indicated. Drive electronics 31 provides the drive signals to the apparatus (such as drive coils or electrostatic plates) used to position the mirrors. These drive signals along with the power and ground lines are provided by cable 37. If the array of mirrors is comprised of two axis mirrors, providing the drive signals will require three or four lines for each of the mirrors of the array. In addition, if the mirror positioning signals are four photodiodes, there typically will be also at least one power signal to an LED associated with each of the mirrors.

As was discussed above, apparatus 11 of FIG. 1 includes an array of mirror devices. Since each of the mirrors of a mirror array operate in the same manner, FIG. 2 illustrates a single mirror of the type used in an array of two-axis mirrors.

Figure 2:
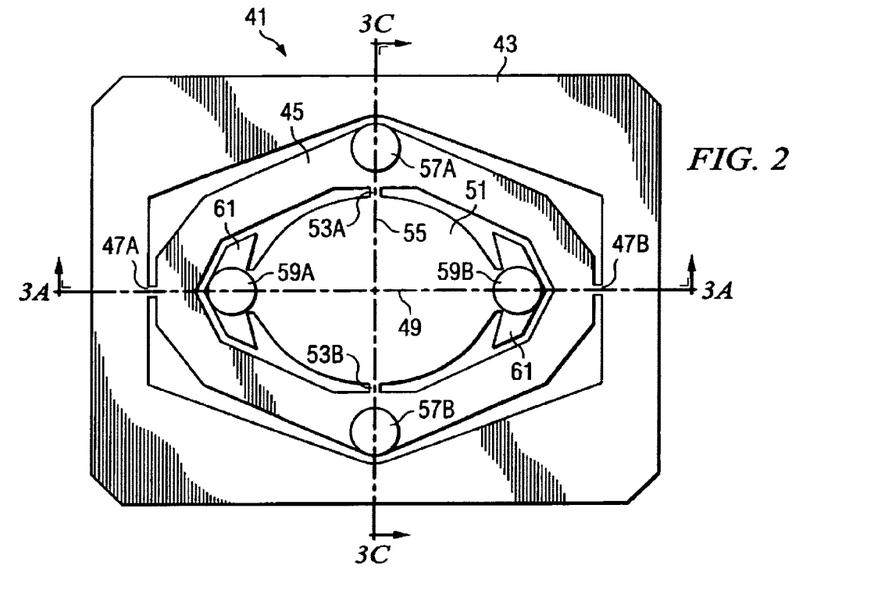
FIG. 2 is a top view of a two-axis mirror device used to make up an array of mirrors used in the switching system of FIG. 1.

Mirror assembly 41, as shown in FIG. 2, includes a frame portion, an intermediate gimbals portion and an inner mirror portion preferably formed from one piece of crystalline material such as silicon. The silicon is etched to provide outer frame portion 43 forming an opening in which intermediate annular gimbals portion 45 is attached at opposing hinge locations 47A and 47B along first axis 49. An inner, centrally disposed mirror portion 51, having a mirror centrally located thereon, is attached to gimbals portion 45 at hinges 53A and 53B along a second axis. 55 that is orthogonal to or rotated, 90° from the first axis. The mirror on mirror portion 51, which is on the order of 100–115 microns in thickness, is suitably polished on its upper surface to provide a specular or mirror surface. In order to provide necessary flatness, the mirror is formed with a radius of curvature greater than approximately 2 meters, with increasing optical path lengths requiring increasing radius of curvature. The radius of curvature can be controlled by known stress control techniques such as, by polishing on both opposite faces and deposition techniques for stress controlled thin films. If desired, a coating of suitable material can be placed on the mirror portion to enhance its reflectivity for specific radiation wavelengths. It should also be understood that, although the shape of the mirror position 51 is illustrated in the drawings as being round, the mirror shape may be of any selected shape, such as square, rectangular, oval, etc.

Mirror assembly 41 may also typically comprise a first pair of permanent magnets 57A and 57B mounted on gimbals portion 45 along the second axis 55 and a second pair of permanent magnets 59A and 59B mounted on extensions 61, which extend outwardly from mirror portion 51 along the first axis. In order to symmetrically distribute mass about the two axes of rotation to thereby minimize oscillation under shock and vibration, each permanent magnet 57A, 57B, 59A and 59B preferably comprises a set of an upper magnet mounted on the top surface of the mirror assembly 41 using conventional attachment techniques such as indium bonding, and an aligned lower magnet similarly attached to the lower surface of the mirror assembly as shown in FIGS. 3A–3D. The magnets of each set are arranged serially such as the north/south pole arrangement indicated in FIG. 3C. There are several possible arrangements of the four sets of magnets which may be used, such as all like poles up, or two sets of like poles up, two sets of like poles down; or three sets of like poles up, one set of like pole down, depending upon the magnetic characteristics desired.

By mounting gimbals portion 45 to frame portion 43 by means of hinges 47A and 47B, motion of the gimbals portion 45 about the first axis 49 is provided. Similarly, by mounting mirror portion 51 to gimbals portion 45 via hinges 53A and 53B, motion of the mirror portion relative to the gimbals portion is obtained about the second axis 55, thereby allowing independent, selected movement of the mirror portion 51 along two different axes.

Figure 3A:
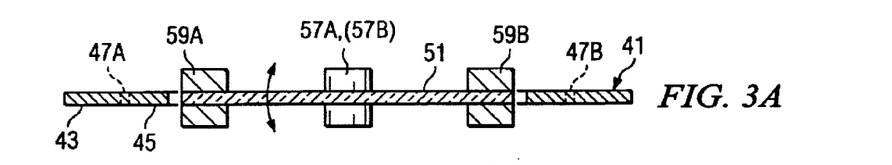
FIGS. 3A through 3D are cross-sectional views of FIG. 2 illustrating rotation or pivoting of the two sets of torsional hinges.
Figure 3B:
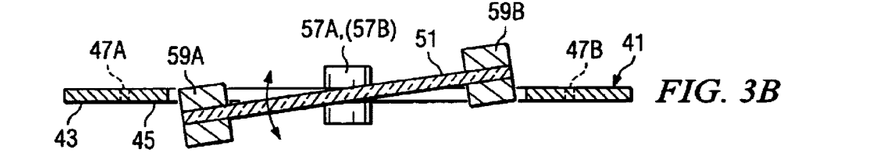
Figure 3C:
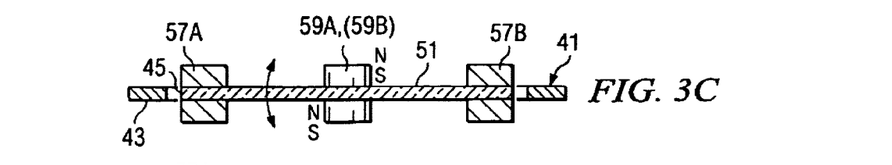
Figure 3D:
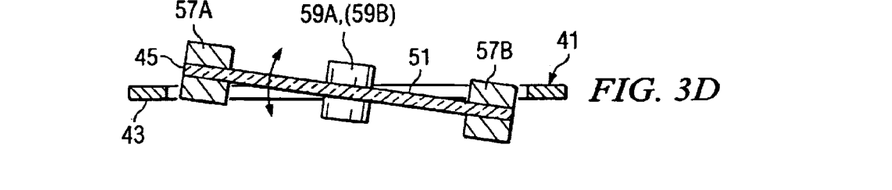

The middle or neutral position of mirror assembly 41 is shown in FIG. 3A, which is a section taken through the assembly along line 3A—3A of FIG. 3. Rotation of mirror portion 51 about axis 55 independent of gimbals portion 45 and/or frame portion 43 is shown in FIG. 3B as indicated by the arrow. FIG. 3C shows the middle position of the mirror assembly 41, similar to that shown in FIG. 3A, but taken along line 3C—3C of FIG. 2. Rotation of the gimbals portion 45 and mirror portion 51 about axis 49 independent of frame portion 43 is shown in FIG. 3D as indicated by the arrow. The above independent rotation of mirror portion 51 about the two axes allows direction of optical beam 15 to the appropriate receiving optical fiber 17A through 17N as needed by the optical switch units and as discussed in FIG. 1.

In order to protect the torsional hinges 47A, 47B, 53A and 53B from in-plane shock, and according to the present invention, stops (not shown in FIG. 2) are provided as will be discussed in detail hereinafter. At this point, it is again noted that the mirror assembly is on the order of 100–115 microns thick, whereas the hinges of the same thickness are on the order of 10 microns wide, thereby providing robust strength in directions normal to the surface of the assembly. However, in order to provide protection against excess in-plane motion cooperating surfaces or stops are formed on gimbals portion 45 and frame portion 43.

Figure 4:
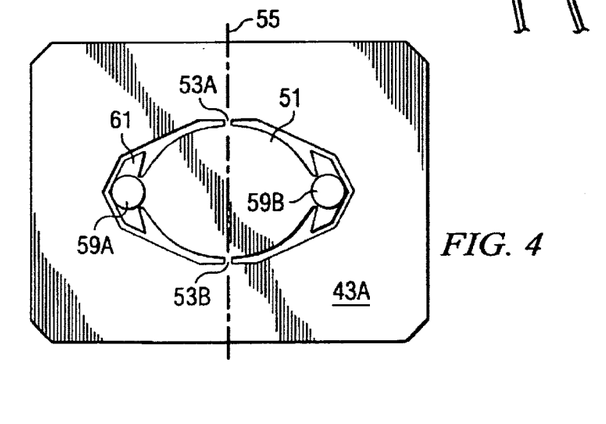
FIG. 4 is a top view of a single axis mirror device suitable for making up an array of mirrors used in a switching system of FIG. 1.

In addition, although FIG. 2 illustrates a two-axis mirror, it may be sufficient that the mirror rotate only about a single axis. Such an arrangement could of course use the two-axis mirror arrangement shown in FIG. 2, by not providing (or not activating) the drive mechanism for one of the axis. However, if a single axis operation is desired, a more rugged mirror arrangement would be to provide mirrors with only a signal axis 55 of rotation and a single pair of hinges 53A and 53B such as illustrated in FIG. 4.

Figure 5:
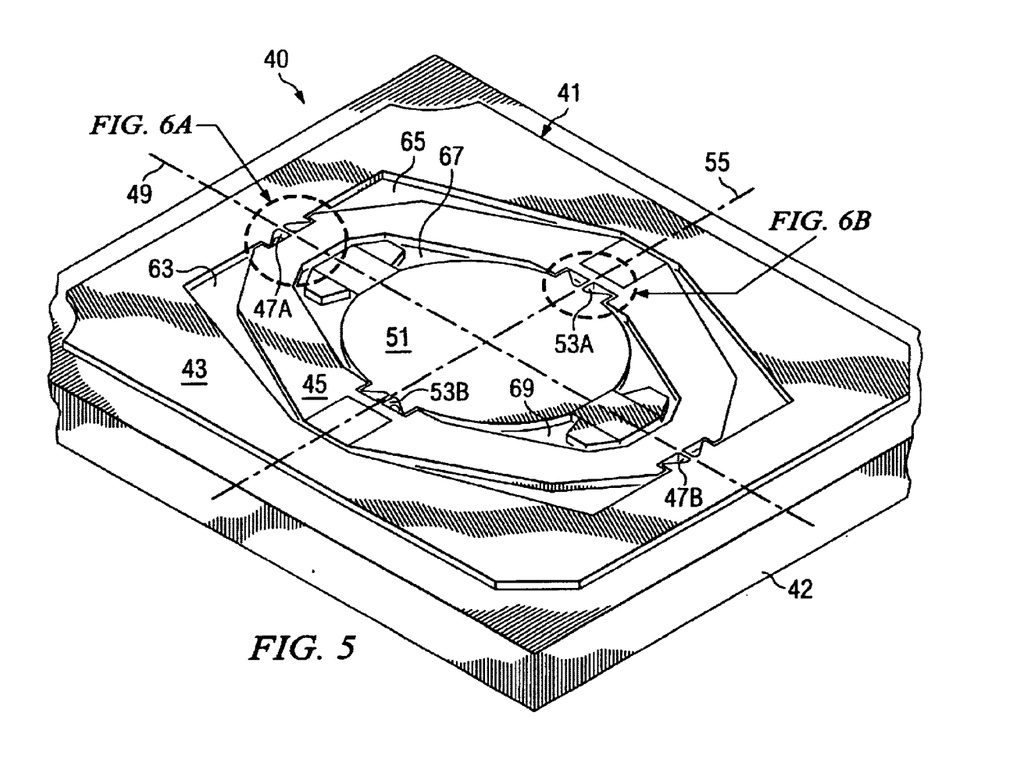
FIG. 5 is a perspective view of a movable assembly according to a first embodiment of the present invention.

FIG. 5 shows a perspective view of the movable mirror assembly 41 of FIG. 2 on a support structure 42. As discussed above, the movable mirror assembly 41 is formed from a single piece of substantially planar material and the functional components are etched in the planar sheet of material (such as silicon) by techniques similar to those used in the semiconductor art. Some of the functional components include the frame portion 43, an intermediate gimbals portion 45, and an inner mirror portion 51. Note that the shape and size of the apertures 63, 69 etched in the silicon and used to define the functional components of the movable mirror assembly 41 may vary from those shown in the illustrative embodiments of the present invention. Hence, the size and shape of the functional components of the movable mirror assembly 41 may vary when applied to various embodiments of the present invention.

Figure 6A:
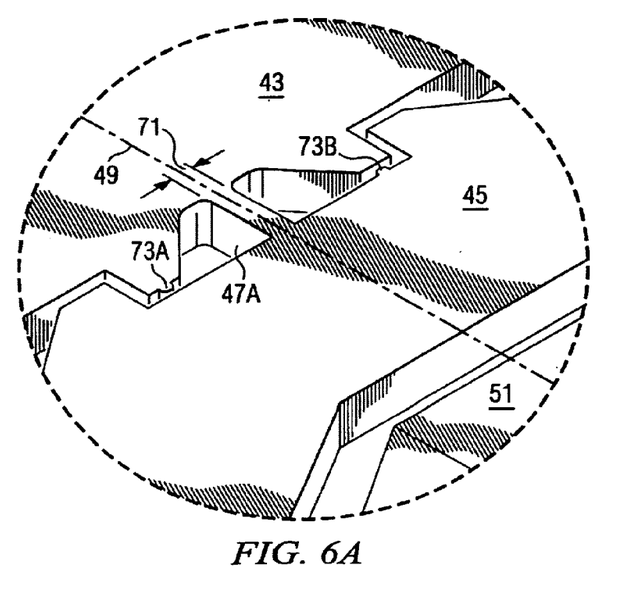
FIGS. 6A and 6B are enlarged views of different embodiments of the torsional hinges and motion stops which are parallel to the hinges, according to teachings of this invention.

As was discussed above, the intermediate gimbals portion 45 is hinged to the frame portion 43 at two ends by a first pair of hinges 47A and 47B spaced apart and aligned along a first axis 49. Except for the first pair of hinges 47A and 49B, the intermediate gimbals portion 45 is separated from the frame portion 43 by apertures 63 and 65 etched or otherwise formed in the planar silicon of the movable mirror assembly 41 (one on each side of the first axis 49). Hence, the intermediate gimbals portion 45 can pivot about the first axis 49 on the first pair of hinges 47A and 47B relative to the frame portion 43. When the intermediate gimbals portion 45 pivots relative to the frame portion 43, the first pair of hinges 47A and 47B act as torsional springs. FIG. 6A is an enlarged view of hinge 47A of the movable mirror assembly 41 shown in FIG. 5. As shown in FIG. 6A, each hinge 47A and 47B may be thinner (in width) as shown by doubled-headed arrow 71 than the thickness of the movable mirror assembly 41. The width of the hinges 47A and 47B, as an example only, may be on the order of 10 microns. However, in other embodiments of the present invention, the thickness of the movable mirror assembly 41 and/or the width of the hinges 47A and 47B may vary as needed or as desired. Changing the dimensions of the hinges 47A and 47B will of course change the effective spring rate of the hinge, as well as the strength and durability. Thus, there is a balance between the desired spring rate for the hinges 47A and 47B and the desired strength and durability of the hinges. Also as shown in FIG. 6A, there is shown a pair of motion stops 73A and 73B which are parallel to or in line with hinge 47A and act to restrict motion along the axis of the hinge. In addition, if these stops are placed at a distance from the hinge axis, they will also help prevent twisting of the hinge around a line normal to the mirror 51. It should be noted that motion stop 73A is shown on frame portion 43 and motion stop 73B is shown on intermediate gimbals portion 45. However, as will be discussed later, the location of the motion stops could be reversed. Alternately, both motion stops 73A and 73B could be on either of frame portion 43 or intermediate gimbals portion 45. Still other embodiments could incorporate one or more motion stops on only side of the hinge. In addition, there could be two or even more motion stops on each side of the hinge.

Referring again to FIG. 5, the inner mirror portion 51 is coupled to the intermediate gimbals portion 45 at two locations by a second pair of hinges 53A and 53B spaced apart and aligned along a second axis 55. In one embodiment, the first axis 49 is substantially perpendicular to the second axis 55. However, in other embodiments, the first axis may not always be perpendicular to the second axis. Except for the second pair of hinges 53A and 53B, the inner mirror portion 51 is completely separated from the intermediate gimbals portion 45 on each side of the second axis 55 by apertures 67, 69 formed in the planar silicon of the movable mirror assembly 41. Hence, the inner mirror portion 51 can pivot about the second axis 55 on the second pair of hinges 53A and 53B relative to the intermediate gimbals portion 45. When the inner mirror portion 51 pivots relative to the intermediate gimbals portion 45, the second pair of hinges 53A and 53B also acts as torsional springs.

Figure 6B:
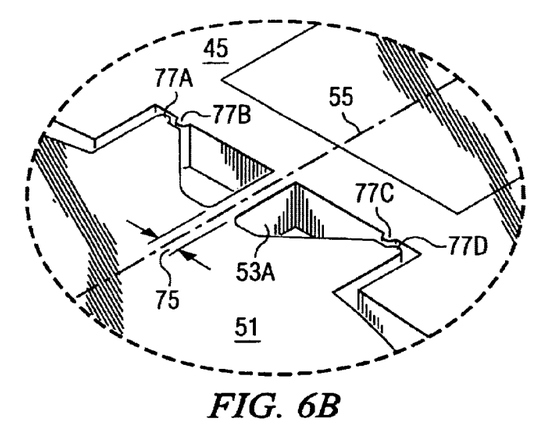

FIG. 6B is an enlarged view of the hinge 53A of the movable mirror assembly 41 shown in FIG. 5. As shown in FIG. 6B, the thickness 75 of the second pair of hinges 53A and 53B is also much thinner (in width) than the thickness of the movable mirror assembly 41. The width of the second pair of hinges is on the order of 10 microns. However, as discussed above in other embodiments of the present invention, the width of the second pair of hinges 53A and 53B also may vary as needed or as desired. Also as shown, and as was the case with the torsional hinges 47A and 47B, motion stops that are parallel to the hinge 53A are located on each side of hinge 53A. In the illustrated embodiment, there is a first pair of stops 77A and 77B on one side of the hinge and a second pair of stops 77C and 77D on the other side. As shown, motion stops 77A and 77D are formed as part of the mirror portion 51, and stops 77B and 77C are formed as part of intermediate gimbals portion 45. However, it will be appreciated that stops 77A and 77B could both be formed on mirror portion 51 or both could be formed on intermediate gimbals portion 45. Also, of course, a single stop such as stop 77A could be formed without also forming stops 77B, 77C and 77D.

Figure 7A:
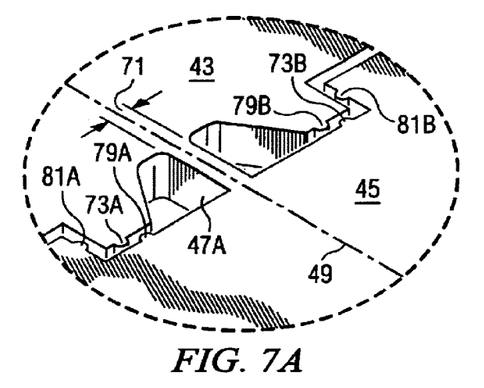
FIGS. 7A and 7B are further embodiments showing motion stops according to the present invention in combination with motion stops which are perpendicular to the hinges.

FIG. 7A also shows the area around hinge 47A of the movable mirror assembly 41 of FIG. 5 and is a further enlarged view of another embodiment of the invention. However, in addition to motion stop 73A and 73B as was discussed with respect to FIG. 6A, FIG. 7B also includes additional stops 79A and 79B that are parallel to axis 49. In addition, FIG. 7A is illustrated with perpendicular motion stops 81A and 81B to provide even greater translational stability.

Figure 7B:
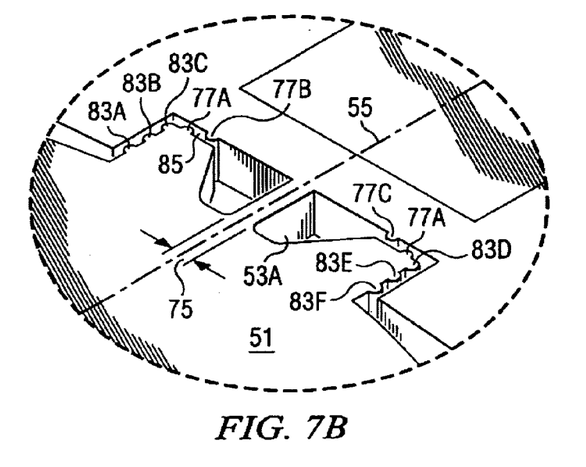

Similarly, FIG. 7B shows the area or region around hinge 53A, including both the parallel translational motion stops 77A, 77B, 77C and 77D of the movable mirror assembly 41 according to this invention as well as the earlier used perpendicular motion stops 83A through 83F.

As disclosed in U.S. Pat. No. 6,295,154, a motion stop or bump projection can be formed within the tolerance spaces between outer edges of the inner mirror portion 51 and the inner inner edges of the intermediate gimbals portion 45. Such a bump projection in the various tolerance spaces allows for an improved or closer tolerance that further limits translation movement of the inner mirror portion 51 relative to the intermediate gimbals portion 45.

As shown, in various ones of the illustrated embodiments, the present invention may include more than one motion stop or bump projection extending within the various tolerance spaces such as tolerance space 85 shown in FIG. 7B. It has been found that by having two or more adjacent bump projections extending within the tolerance space from either or both of the edges defining the tolerance space, the translational motion can be further limited, which, of course, further limits the unintended forces that are experienced by the hinges. Consequently, by further limiting the translational motion, the reliability, life, and durability of the movable mirror 51 and intermediate gimbals portion 45 is further improved. Because the hinges 47A, 47B, 53A and 53B are typically one of the first components to fail in an optical switch device having a movable mirror assembly 41 with torsional hinges, an improvement to the reliability, life, and durability of the hinges may yield a direct improvement on the reliability, life, and durability of an optical switch device or an optical switch station that incorporates such movable mirrors.

Due to the thickness of the planar material from which the movable mirror assembly 41 is made (e.g., about 100 microns) relative to the size of the tolerance space (e.g., about 10 microns), as one portion (e.g., inner mirror portion 51) pivots relative to another portion (e.g., intermediate gimbals portion 45) about an axis (e.g., second axis 55), the projections move closer to the opposing edge and further limit the translational movement between the two portions. Hence for the range of pivotal movement of the movable mirror assembly 41 during typical use (e.g., in an optical switch device), the motion stops or projections act as translational motion bump stops over the entire range of pivot motion for the movable mirror assembly 41, and the ability to limit translational movement improves as the tilt angle increases.

Although FIGS. 6A, 6B, 7A and 7B illustrate the tolerance spaces adjacent a hinges 47A and 53A, there are, of course, other tolerance spaces, each which may include one or more motion stops extending therein in accordance with the present invention and formed at other hinge locations on the movable mirror assembly 41. Referring to FIGS. 4 and 5, there will be up to eight spaces in the embodiment of FIG. 4 and up to a total of sixteen tolerance spaces in FIG. 5, and each space may include one or more projection extending therein in accordance with the present invention.

Figures 8A, 8B:
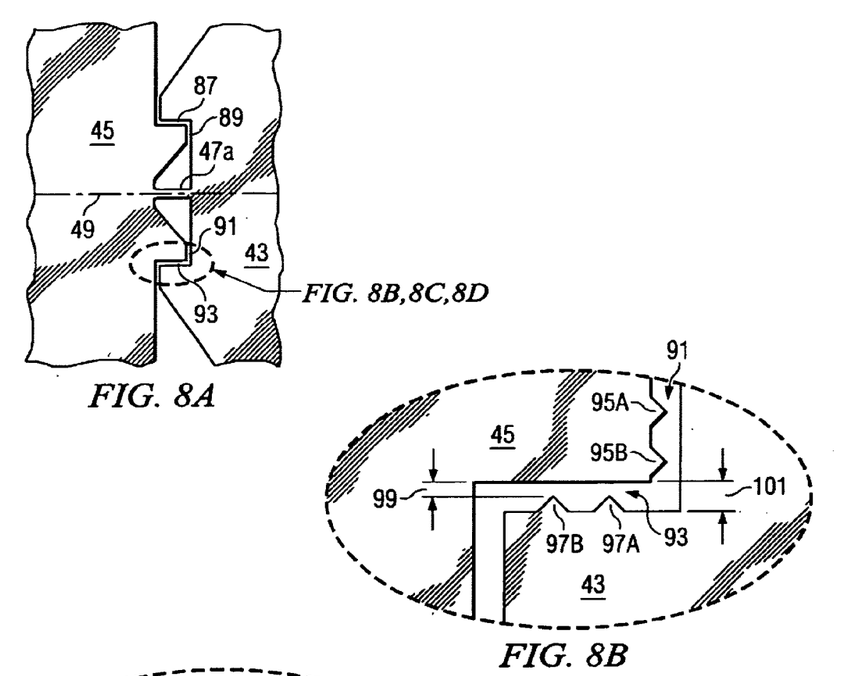
FIGS. 8A through 8D illustrate various possible shapes of the motion stops.

As shown in FIG. 8A, there are four tolerance spaces 87, 89, 91 and 93 in the region of hinge 47A., At least one projection extends into at least one of the spaces 89 or 91 in accordance with the present invention to provide stops parallel to hinge 47A. Of course, motion stops could be formed on each side of the first axis 49 adjacent to each hinge. Also as will be appreciated, there is also tolerance space with at least one projection extending into one of the tolerance spaces in the regions around the hinges along the second axis 55. Thus, according to one embodiment, the motion stops adjacent to the first axis 49 act as stops and limit translational motion in directions generally parallel to the first axis 49. Similarly, the bump projections adjacent to the second axis 55 act as bump stops and limit translational motion in directions generally parallel to the second axis 55. Also as discussed above, additional motion stops may be added to further limit translational motion in directions generally perpendicular to the first and second axis.

In the illustrative embodiments of FIGS. 6A, 6B, 7A and 7B, the motion stops or projections are half-circle shaped with a rounded tip profile. However, referring to FIGS. 8B, 8C and 8D, there are shown enlarged views of tolerance spaces 91 and 93 having multiple bump projections extending therein for other embodiments of the present invention. In FIG. 8B, the projections 95A, 95B, 97A and 97B are generally triangular shaped and each extend from an outer edge of the intermediate gimbal portion 45, and from an inner edge of the frame portion. Notice in FIG. 8B that the distance 99 between the tip of the projections 97A and 97B and the opposing edge is about half that of the distance 101 between the two edges defining the tolerance space 93. Therefore, the distance that the intermediate gimbals portion 45 can traverse before being stopped by the projections is about half that which it would be if there were no projections.

Figure 8C:
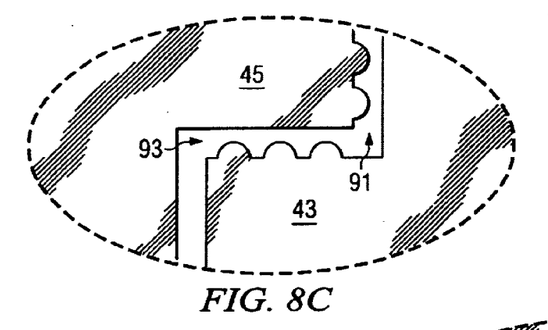
Figure 8D:
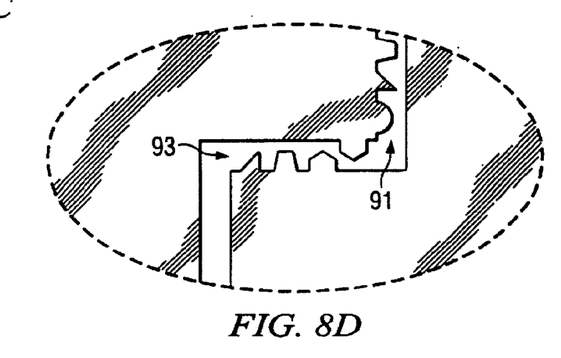

FIG. 8C shows the projections of an embodiment, which arc half-circle shaped. It is believed that the half-circle-shaped projections with rounded tip profiles are preferable over the triangular-shaped projections with pointed tip profiles.

Furthermore, although the shape of each projection is the same and uniform for the embodiments shown in FIGS. 8B and 8C, in other embodiments of the present invention, a projection may have a different shape from another adjacent projection and/or from other projections within the same tolerance space and/or within the same embodiment. This is illustrated in the embodiment shown in FIG. 8D, which has six projections within a tolerance space 91 and 93, wherein the projections have four different shapes.

Still further, the number of motion stops within a tolerance space is only limited by the space constraints of the tolerance space (i.e. the length of the tolerance space). Hence, as mentioned above, there may be one, two, (see FIG. 8B), three projections (see FIGS. 8C and 8D), or more within each of the tolerance spaces. Generally, the more projections that can be formed within a given tolerance space, the better the performance in limiting translational movement. Therefore, the number, size, and position of the multiple projections for an embodiment may vary in any combination.

The embodiments shown and discussed have each had the capability for pivotal movement about first and second axis 49 and 55. However, as discussed above, in a more simplified and limited embodiment, there may be only one pair of hinges and only one pivotal axis (as shown in FIG. 4); thus limiting such embodiment to pivotal movement about the one axis. In such case, there would be no intermediate gimbals portion 45. Likewise, a more complex embodiment of the present invention may have more than two pivotal axis (e.g., three axis and two intermediate gimbals portions) (not shown). An advantage of the present invention is that multiple motion stops or projections may be incorporated into an existing design without having to completely redesign or reconfigure the etching patterns, other than any needed allowances for forming the projections.

Although the embodiment shown and discussed herein was with respect to an optical switch application, other embodiments of the present invention may be incorporated into other types of optical devices, such as add-drop multiplexers, for example. Also, the present invention may be incorporated into other types of devices (other than optical devices), such as a butterfly valve for controlling or directing fluid flow, for example. Therefore, a movable structure with torsional hinges and translational bump stops in accordance with the present invention may be incorporated into a wide range of devices and systems.

It will be appreciated by those skilled in the art having the benefit of this disclosure that an embodiment of the present invention provides an improved translational motion stop to, among other things, extend the life of torsional hinges for movable structures. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A movable structure comprising:
   a support portion;
   a movable portion hinged to the frame portion by a first pair of torsional hinges spaced apart along an axis, such that the movable portion can pivot relative to the support portion about the axis;
   the movable portion having at least one edge that is substantially perpendicular to said axis and substantially parallel with and immediately adjacent to a corresponding edge of the frame portion so as to define a space between the edge of the movable portion and the corresponding frame portion edge; and
   at least one projection extending from at least one edge of the first movable portion and the corresponding frame portion edge, and into said defined space, said projection being adapted to limit translational motion of the movable portion relative to the frame portion.

2. The movable structure of claim 1, wherein the first movable portion of the movable structure has a reflective mirror surface formed thereon.

3. The movable structure of claim 1 wherein said at least one edge of said movable portion comprises at least two edges perpendicular to said first axis and parallel with and adjacent to corresponding edges of said frame portion so as to define at least first and second spaces located one each proximate one each of said pair of spaced torsional hinges, and said at least one projection including at least two projections, one each projection of said at least two projections extending within each of said first and second spaces.

4. The movable structure of claim 1 wherein said at least one edge of said movable portion comprises at least two edges perpendicular to said first axis and parallel with and adjacent to corresponding edges of said frame portion so as to define at least first and second spaces, said at least first and second spaces located one each on each side of one torsional hinge of said pair of torsional hinges and said at least one projection including at least two projections one each projection of said at least two projections extending within each of said first and second spaces.

5. The movable structure of claim 4, wherein said at least two edges comprise at least two pair of edges defining at least first and second pairs of spaces, one each of said at least first and second pairs of spaces located one each proximate one each said pair of torsional hinges and said at least one projection including at least four projections, one each projection of said four projections extending within each space of said first and second pair of spaces.

6. The movable structure of claim 1, wherein said movable portion is an intermediate gimbals portion and further comprising another movable portion hinged to said intermediate gimbals portion by a second pair of torsional hinges spaced apart along another axis such that the second movable portion can pivot relative to the intermediate gimbals portion about a second axis.

7. The movable structure of claim 3, wherein said movable portion is an intermediate gimbals portion and further comprising another movable portion hinged to said intermediate gimbals portion by a second pair of torsional hinges spaced apart along another axis such that the second movable portion can pivot relative to the intermediate gimbals portion about a second axis.

8. The movable structure of claim 4, wherein said movable portion is an intermediate gimbals portion and further comprising another movable portion hinged to said intermediate gimbals portion by a second pair of torsional hinges spaced apart along another axis such that the second movable portion can pivot relative to the intermediate gimbals portion about a second axis.

9. The movable structure of claim 5, wherein said movable portion is an intermediate gimbals portion and further comprising another movable portion hinged to said intermediate gimbals portion by a second pair of torsional hinges spaced apart along another axis such that the second movable portion can pivot relative to the intermediate gimbals portion about a second axis.

10. The movable structure of claim 3, wherein said another movable portion has a reflective mirror surface formed thereon.

11. The movable structure of claim 5, wherein said another movable portion has a reflective mirror surface formed thereon.

12. The movable structure of claim 6, wherein said another movable portion has a reflective mirror surface formed thereon.

13. The movable structure of claim 1, wherein said movable portion further comprises at least another edge that is substantially parallel to said first axis and substantially parallel with and immediately adjacent to a corresponding edge of the frame portion so as to define another space between said edge, and at least another projection extending within said defined another space.

14. The movable structure of claim 6 further comprising:
at least another projection extending from an edge of said another movable portion and another edge of said intermediate gimbals portion, and extending within a space formed between said another edge of said intermediate gimbals (movable) portion and said edge of another movable portion, wherein said another edge of said intermediate gimbals portion is substantially perpendicular to said another axis and substantially parallel with said edge of another movable portion, said at least another projection being adapted to limit translational motion of said another movable portion relative to said intermediate gimbals portion.

15. The movable structure of claim 14, wherein said another axis is substantially perpendicular to said axis.

16. The movable structure of claim 1, wherein said at least one projection has a shape selected from a group consisting of a generally triangular shape, a generally half-circle shape, a generally trapezoidal shape, a generally rectangular shape, a generally rounded shape, and an arbitrary shape.

17. The movable structure of claim 1, wherein said at least one projection comprises at least two projections.

18. The movable structure of claim 14, wherein said at least another projection comprises at least two projections.

19. The movable structure of claim 13, wherein the first movable portion of the movable structure has a reflective mirror surface formed thereon.

20. The movable structure of claim 14, wherein said another movable portion has a reflective mirror surface formed thereon.

21. The movable structure of claim 15, wherein said another movable portion has a reflective mirror surface: formed thereon.

22. A movable mirror formed in a single piece of substantially planar silicon crystal material, the movable mirror comprising:
a frame portion forming a border around the movable mirror;
an intermediate gimbals portion hinged to the frame portion by a first pair of torsional hinges, each hinge of the first pair of torsional hinges extending along a first axis in said planar material;
each side of the first axis for each hinge of the first hinge pair, including a first space formed between an outer edge of the intermediate gimbals portion and an inner edge of the frame portion, wherein the outer edge of the intermediate gimbals portion is substantially perpendicular to said first axis and substantially parallel with and adjacent to the inner edge of the frame portion at the first space;
at least one projection extending from at least one of the outer edges of the intermediate gimbals portion and the inner edge of the frame portion into said first space, said at least one projection being adapted to limit translational motion of the intermediate gimbals portion relative to the frame portion;
an inner mirror portion hinged to the intermediate gimbals portion by a second pair of torsional hinges, each hinge of the second pair of hinges extending along a second axis in said planar material, wherein the second axis is substantially perpendicular to the first axis, and the inner mirror portion has a reflective mirror surface formed thereon;
each side of the second axis for each hinge of the second hinge pair, including a second space formed between an outer edge of the inner mirror portion and an inner edge of the intermediate gimbals portion, wherein the outer edge of the inner mirror portion is substantially perpendicular to said second axis and substantially parallel with and adjacent to the inner edge of the intermediate gimbals portion at the second space; and
at least another projection extending from at least one of the outer edges of the inner mirror portion and the inner edge of the intermediate gimbals portion into said second space, said at least another projection being adapted to limit translational motion of the inner mirror portion relative to the intermediate gimbals portion.

* * * * *